United States Patent [19]

Weintraub et al.

[11] 4,270,226
[45] May 26, 1981

[54] REMOTE CONTROL SYSTEM

[76] Inventors: Morton Weintraub, 1542 47th St.;
Elliot Waxman, 1825 50th St.;
Bernard Gendelman, 1340 52nd St.,
all of, Brooklyn, N.Y. 11219

[21] Appl. No.: 21,447

[22] Filed: Mar. 19, 1979

Related U.S. Application Data

[63] Continuation-in-part of Ser. No. 911,168, May 30, 1978, abandoned, which is a continuation-in-part of Ser. No. 707,855, Jul. 22, 1976, abandoned.

[51] Int. Cl.³ ............................................. H04B 1/16
[52] U.S. Cl. .................................................. 455/353
[58] Field of Search ................... 325/37, 64, 389–395; 358/194; 455/151, 352, 353

[56] References Cited

U.S. PATENT DOCUMENTS 4,145,720  3/1979  Weintraub et al. ................. 358/194

OTHER PUBLICATIONS

Electronic Servicing, Jan. 1975, pp. 25–27.

*Primary Examiner*—Robert L. Richardson

[57] ABSTRACT

The invention relates to a system providing for wireless remote control of radio receivers, said controls extended to include the separation of a received mono signal into two or more channel stereo signals, converting the incoming signal of a musical instrument to sound like another instrument, or the elimination of the sound output of voice or music from a music voice composition.

12 Claims, 10 Drawing Figures

REMOTE CONTROL SYSTEM

This is a continuation in part of the copending applications of Morton Weintraub et al Ser. No. 911,168 filed May 30, 1978 which is a continuation in part of Ser. No. 707,855 filed July 22, 1976 both now abandoned.

DESCRIPTION OF PRIOR ART

Remote control of radio receivers found in prior art presented the following shortcomings:

1. Tuning and channel selection required either direct connection to or modification of the radio receiver
2. AM music signals could not be altered to provide channeled stereo sound at the receiver as a function of listener preference
3. Neither AM or FM radio music signals were received as transmitted without possibility of alteration of the signal so as to provide substitution of instrumentation.
4. The sound of live music did not eminate from radio signals.
5. There was no possibility of eliminating the voice or music signal from a music-voice composition.

SUMMARY OF THE INVENTION

The object of this invention is to provide a remote control apparatus that provides tuning and channel selection without direct connection to or modification of the radio receiver.

Another object of this invention is to provide the means for selecting the mono signal and separating same to a two or more channel stereo signal.

Another object of this invention is to provide the possibility of reproducing a new live signal source of substitute instrumentation as a function of listener preference.

Another object of this invention is to provide the means of eliminating voice or music from from a music-voice composition.

Other objectives will become apparent during the course of the disclosure.

BACKGROUND OF THE INVENTION

This invention relates to the remote control of radio signals in so far as to provide wireless remote control of tuning and plural function control of radio receivers, including the mixing of an auxiliary intelligence signal into the incoming signal, separating a mono signal to a plural channel stereo signal, creating new signals for reproducing a live music sound stemming from the original baseband signal which may be heard in mono or stereo, eliminating the voice or music signal as a function of listener preference.

DETAILED DESCRIPTION OF INVENTION

Figure 1:
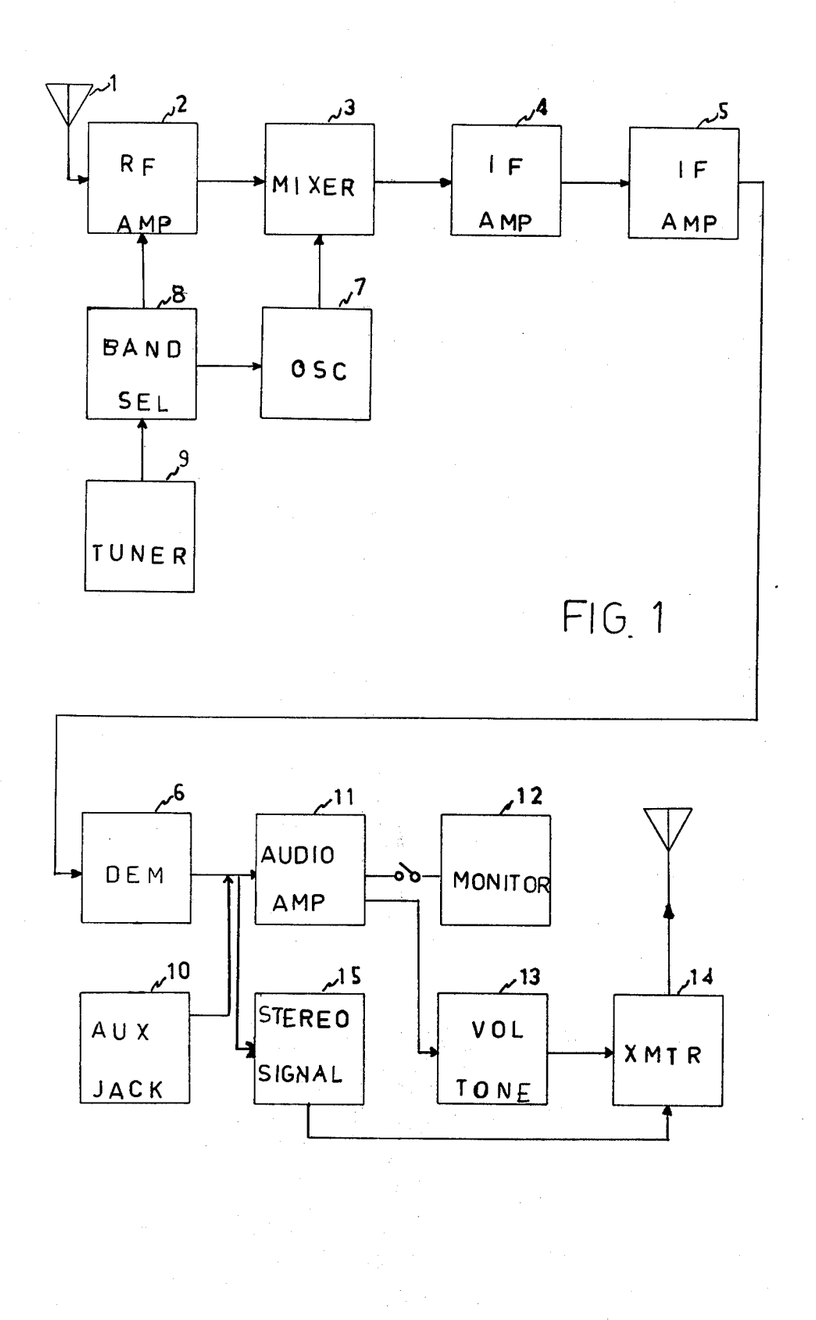
FIG. 1 is a block diagram of an Electronic Guided Remote Control (E.G.R.C.) apparatus (Model 1) for wireless AM-FM radio reception.

FIG. 1: Antenna (1) picks up any and all signals transmitted into the airspace. The band selector (8) selects the desired AM-FM band or short wave or long wave etc. The selected band is adjusted by the tuner (9) which selects the desired station. The amplified signal is mixed by the mixer (3) in conjunction with the oscillator (7). The mixed output from the mixer (3) is fed to the intermediate frequency amplifier (4) whereby it is amplified once and then passed on to the intermediate frequency amplifier (5) whereby it is amplified a second time. The amplified signal is then passed on to the demodulator (6) which separates the radio wave carrier from the actual sound. The audio amplifier (11) receives the actual sound and passes it on to the four controls, volume, bass, treble and midrange controls (13). Then after, the actual sound is retransmitted by the transmitter (14) FM 108 MC, and received by the AM-FM radio receiver. The monitor (12) may be plugged in and set to ON thereby enabling the input to the transmitter (14) FM 108 MC to be monitored. The transmitter (14) FM 108 MC connects the E.G.R.C. through the air waves and enables the E.G.R.C. to transmit via (14) any transmitted signal—short wave or long wave—from any transmitter. Four separate controls (13) enable the E.G.R.C. reception to be set and controlled at a selected volume, bass, treble and midrange strength. The audio amplifier (11) feeds into the volume, bass, treble and mid-range controls (13) and enables a degree of amplification appropriate for selected high or low intensity. The pilot stereo (15) 19 KC, amplifies stereo 19 KC signal and transmits it again, thereby enabling stereo reception. The demodulator (6) receives the intermediate frequency signal from (5) and demodulates it. The output of demodulator (6) is separated into two different signals consisting of a pilot frequency and an actual sound signal. The actual sound signal passes through the audio amplifier (11) whereby it is amplified even stronger. The amplified actual signal passes through controls (13) and thenafter is retransmitted from transmitter (14), 108 MC. The second signal, the pilot frequency 19 KC from demodulator (6) passes onto the pilot stereo (15) 19 KC amplifier, and thence to transmitter (14) 108 MC. It is retransmitted from transmitter (14) 108 MC which the receiver is tuned to the same station, 108 MC, the selected empty station.

It is important to note that a Slave Driver is a wireless unit in itself. At all times the Slave Driver is not connected mechanically, save only, if desired to turn the power of the system ON or OFF executed by relay 119 and if disered, for an auxiliary output for a PA system at aux. 151. The general use of the Slave Driver is to interperate one signal to another.

In this connection FIG. 1 may be used as a slave since it receives a transmitted signal from another master. Vol. control 13 is now a secondary control and enables a refinement of the signal even after a master E.G.R.C. setting.

Note also, that a Slave Driver can be constructed in a manner whereas instead making use of one transmitter (14 in FIG. 1) one vol. control (13 in FIG. 1) one amplifier (11 in FIG. 1) we could have 4 or more sets of squares 11, 13,14, whereby each set would be capable of transmitting a different type of transmission at the same time. Namely, the first set would transmit FM for reception on FM band. The second set of 11,13,14 would transmit an AM signal for reception on AM band. The third set of 11,13,14 would transmit on TV, whild a fourth set would transmit an audio magnetic signal on a C shaped core enabling a tape player to pick up wirelessly the audio signal of the C shaped core placed in close proximity and play it back at its speaker.

Now, with the Slave Driver as described above in close proximity over a tape recorder (player) and close to an AM-FM radio and TV all four apparatuses will receive sound at the same time.

The secondary controls will now be of utmost use to balance out the sound of all four apparatuses so that all operate at their maximum; control 13 would be adjusted by the listener for what is best in his judgement for FM in the first set of controls described above; control 13 would be adjusted for AM in the second set of controls; control 13 would be adjusted for TV in the third set of controls; control 13 would be adjusted for audio level in the fourth set.

When a Master Drive unit like FIG. 1 would drive the Slave Driver unit—which in our example is FIG. 1—all the sound coming from all four apparatuses will be adjusted evenly since the user has pre adjusted control 13 to desired level of each set, the main volume from the Master Drive unit will now operate evenly throughout all apparatuses.

A similar set up may be implemented with parts 1-6 (FIG. 1) whereby duplicating 3 or 4 different types of tuners e.g. for AM and FM permitting the user to shift around one set of tuners to operate in conjunction with any transmitter of any of the 4 sets of transmitters described above. This would be accomplished whereby each tuner having a selector at its demodulator 6 output to select one or all or some of the group of transmitters desired.

Also two tuners may be used to pick up two distinct signals joining same at the output of their demodulator 6 to form a composite signal. For example, a user desiring 4 channel sound would have his 4 microphones set into 4 auxiliary jacks (similar to 10 in FIG. 1) of 4 Master Drive controls or into one Master Drive containing 4 transmitters and a Slave Driver (with four tuners) would receive the 4 sounds via a different transmitter and would retransmit such signals to 4 different receivers and create a single composite signal with 4 channel sound. Another example: one transmitter would be used to transmit the speaker sound of a telephone while one tuner would receive sound radio waves and induce it into the telephone thereby resulting in wireless conversation to one or more people.

Generally stated, the system described herein provides the capability of increasing the overal equipment functions. For example, a TV or radio receiver with a defective tuner (not being able to pick up all stations) will have its tuning functions corrected with the use of the E.G.R.C. wirelessly and remotely. Also, signal characteristics such as bass, treble, may be corrected to better than the original signal of the same set when "new". Moreover, even poor signals transmitted from the original transmitting station may be corrected to the point whereby the actual output of the E.G.R.C. is better refined than the transmission of the original station.

Moreover, new sound features may be produced on a speaker, which the transmitting station did not transmit. For example, reverberations may obtained by connecting monitor 12 (FIG. 1) to a reverberation unit with the output fed to auxiliary jack 10, causing thereby a reverberation signal over transmitter 14, thereby providing customized sound over any receiver.

Moreover, the system as described herein would serve to obviate the need for high antennas for proper functioning of weak receivers. Also, in areas where AM signal interference is high (or the AM section is entirely defective) e.g. machines connected on one line with the receiver, such interferences would be eliminated by the E.G.R.C. since it operates on batteries (or it may transmit the AM signal on the FM band).

Moreover, new features that would be added to receivers ordinarily cousing them to become obsolete e.g. the reception of a new type of signal, would now provide a system for correcting such receivers. The E.G.R.C. would interpret such new signals and incorporate them in the old set. This may be accomplished simply whereby the E.G.R.C. is constructed with demodulation means for such new signals e.g. if a transmitting station should decide in the future to transmit some parts of a signal in a phase relationship format. The E.G.R.C. having the demodulation means to change the phase signal to make sense for older receivers, transmitting the new sensible signal to the older receivers. Hence, a signal adjusted E.G.R.C. may serve to correct many old receivers without altering the the receivers.

It should be noted that a plurality of remote control apparatuses (for TV or radio) described herein, when each is tuned to each other, each receiving the composite signal and retransmitting it to the next remote control apparatus with in transmitting range of each other. This thereby will provide plural function control of a receiver by one or more remote control apparatuses that are in or outside the transmitting range of the receiver, as the signal is passed on from one remote control apparatus to another within transmitting range and then on beyond transmitting range thereby providing a possibility of receiving and controlling numerous types of band receivers beyond the transmission range of a base station and of the first remote control apparatus but within transmission range of the last, heance providing low power transmission from greater distances.

Also, when desired, each remote control apparatus may have a different range of sound transmission capability e.g. the first remote control apparatus receiving an FM signal and retransmitting the received signal as an AM signal in its are. The second remote control apparatus changing the AM signal to a phazed transmission signal or to a short wave or to CB and so on. Resulting in a single signal being received at the 1st remote apparatus, area of transmission, a combined signal at a 2nd apparatus resulting from the received signal from the first apparatus and the additional signal from its own auxiliary input. A third combined signal would be received at a remote control apparatus that is out of range of the first but within transmission range of the second remote control apparatus, resulting from the signal of the first remote control apparatus, that was passed on to the second remote control apparatus and the signal of the second remote control apparatus plus an additional signal from its own auxiliary input and so on thus adding signals to remote control apparatuses within different transmission range areas.

It should be noted that where variations are required to change a signal as desired or to add in different signals via a microprocessing unit or a micro computor or circuit, for remote wireless control of said unit or operation, the unit or circuit would be connected between modulator 6 and amplifier 11 (FIG. 1).

Stereo sound is generally produced by the grouping of instruments at specific locations for recording, whereby the the bass instruments (such as drums) is placed at the right and the treble instruments (such as flutes) on the left while midrange (such as speach) is produced on bothe speakers.

The main principle in turning a mono signal into a sereo sound is to break up the mono signal and channel same.

Figure 2:
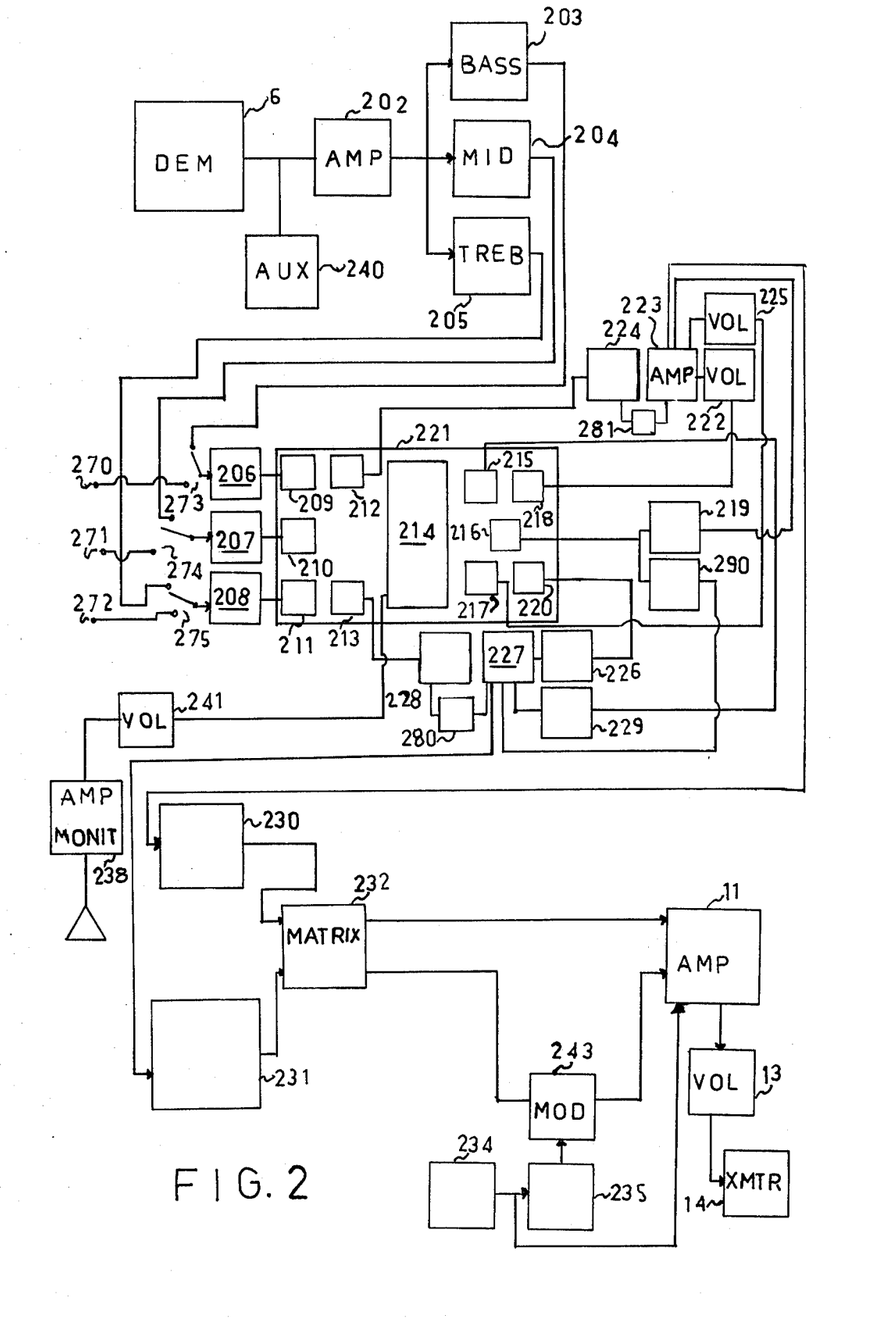
FIG. 2 is a block diagram of the means for separating a received mono radio signal into a channeled sterio signal.

FIG. 2 is a block diagram describing how the above is accomplished. The entire figure is connected to the output of the demodulator 6 of FIG. 1.

The mono signal enters from demodulator 6 to amplifier 202 which serves to amplify the sound signal to the point whereby it may be filtered. Auxiliary 240 serves to introduce desired additional audio signals for mixing or it may serve to convert an outside mono signal—e.g. a signal eminating from a microphone—into stereo sound.

Bass filter 203, filters out all midrange and treble signals, allowing only bass signals at its output. Midrange filter 204 serves to filter out low bass and high treble signals, leaving only midrange signals at its output. Treble filter 205 serves to filter out low bass and midrange signals leaving only the high high treble signals at its output.

Signals from filter 203 may be channeled into record amplifier 206 while those of the output of filter 205 are channled into record amplifier 207, and those of the output of filter 205 are channled into record amplifier 208. Record amplifier 206 enters its low bass signal on to magnetic recording head 209, while record amplifier 207 enters its midrange signals onto recording head 210, and record amplifier 208 enters its high treble signals onto recording head 211. All bass midrange and treble signals are recorded on wide recording magnetic tape 221 which is moved from left to right by a motor (not shown).

The signals eminating from record head 209 will be picked up by playback head 218 and fed into volume control 222, serving to adjust the volume of the signal that is fed into amplifier 223 and record amplifier 224, thereafter onto recording head 212.

At this point we have created a bass echo simply by recording the sound signals from playback head 218 with record head 212—wherein the echo volume is controlled by volume control 222. A treble echo is similarly created by playback head 220 playing the recorded treble signals of record head 211 as tape 212 passes by feeding the signals into volume control 226, serving to set the treble echo level, into amplifier 227 and thereafter into record amplifier 228 and record head 213. On the right side, amplifier 227 serves to receive two signals of the bass instruments, namely the mono signal and the echoed signal for input to matrix 230. On the left side amplifier 223 receives both mono and echoed signals of the high treble instruments for input to matrix 231.

Note that bass signals usually channeled to the right side may be shifted to the left side while treble signals usually channaled to the left side may be shifted to the right side for desired effects. This is accomplished as follows: playback head 215 picks up bass signals from record heads 209, 212 and feeds same into volume control 229 which acts as a control of the amount of bass that is fed to amplifier 227 and to left imput to matrix 231. Hence, a right side echoed bass signal is channeled to the left side immediately following an identical mono sound signal on the right side—providing thereby a partially delayed echoed sound of the same signal on two channels. This kind of sound signal would provide the sound evvect of a bass instrument—a drum, for example—crawling accross the room from speaker to speaker.

The same procedure and effect holds true for treble sound signals. Signals from playback head 217 are fed to volume control 225 (serving to control treble volume in the same way as does volume control 229 for bass) and are fed to amplifier 223, whereas amplifier 223 feeds its signal to right side imput to matrix 230.

Record amplifiers 228 and 224 may if desired be closed off so that it not produce an echoed sound. This increase or decrease or the absence of volume is executed by volume controls 280,281.

Hence, similar to stereo, the stereo sound produced by the present invention, is one whereby the sound of treble instruments are heard on the left side and echoed on the right side, while the sound of bass instruments are heard on the right side and echoed on the left. However, there is a distinct advantage of the present procedure over conventional stereo sound. Whereas with previous stereo sound echo speed could not be adjusted faster or slower, higher or lower, as a function of listener preference, the present system allows for these adjustments. Echo volume is adjusted by volume control 225, 229, while echo speed is adjusted by adjusting the motor speed driving tape 221. Tape speed adjustment may be accomplished by employing a variable speed motor or by employing various gears controlling tape speed. The faster the tape speed the shorter the echo sound and vice versa. Shorter echo sounds provide a stereo image of instruments close by the microphone, vice versa for longer echo sounds.

Also, an effect may be created whereby when for example we have a person talking into a microphone (mono); from his right side may be heard immediately following, the sounds of a bass drum while the sounds eminating from the left side may create an image of microphones being situated far away from the speaker as their time lapse is longer. This may be accomplished by implementing record head 210 to record the mono voice signal, picked up by playback head 216. The signals is divided into volume controls 219,290. These will select the signal amplitude for right and left sides. If a mono sound is desired, volume control 219, 210 would be set at the same level, since amplifier 223 passes the signal from 219 to the right side while amplifier 227 passes the similar signal of the same level from volume control 290 to the left side creating thereby a mono signal.

It should be noted that the following record heads are moveable towards left or right: 218,215,212,220, 217,213, creating thereby echo(stereo) images of various lengths. If, e.g. head 220 were moved to the extreme right while head 218 remains at its present position, the signal from head 220 would follow that of 218 after a time delay.

After signals are mixed in matrix mixer 232 the R+L signal is passed onto amplifier 11 (FIG. 1) while the R−L signal is passed onto 38 KC modulator 243 and thereafter passed on to amplifier 11 along with the output of 19 kc signal from 234. Frequency doubler 235 creates the 38 kc signal for the modulator. Signals from amplifier 11 (FIG. 1) are fed to volume control 13 and to transmitter 14.

The listener connects to amplifier monitor 238 to monitor the total sound. Note that playback head 214 is large enough to cover the entire width of tape 212 creating one mono signal, although stereo(echoed) signals be present on tape 221. Note also, that additional heads may be added as well as additional parts for mixing e.g. a bass signal of 200 cycles may be echoed in a separate echo chamber for a longer or shorter duration as desired. Also, many more filters similar to 203,204,205 may be added for finer deliniation of bass, treble and midrange instruments. Equalizers may also be added with the output thereof proceding to the left or right sides or both sides. Monitor 238 monitors the sound of heads 209–211 through its speaker and is controlled by volume control 241.

It should be noted that tape 221 may constructed as a single wide strip to accommodate recording heads 209-211 as shown or it may be constructed of three strips, one for each head. Also, heads may be constructed as a single head that is electronically switched for different track recording.

Hence, stereo sound is accomplished by heads 215–218,220, whereby heads 215–217 create the basic L+R and mixed mono voice sound. When heads 215–217 are set so that head 216 receives the first sounds, followed by head 215, 217 which are equally aligned, playback heads 218, 220 create the natural stereo echo sound since 218, 220 provides the sound effect as flowing from L to R or from R to L. 212, 213 simply add echo which enriches the stereo sound.

Moveable recording heads 218,210,220 are moved along their respective grooves or selves manually via their respective handles jotting out from the rear of the system. Such movable heads may be connected by wire or via tracks transfering signals to heads.

Distance calibrations for moveable heads may be set up as follows: 0 at center +1,2,3,4 ... to right; −1,2,3,4 ... to the left. This would provide the user with a numbered relationship as to how far each head is away from another. For example, should the user desire that the first sounds be heard out of signals from head 218, he would then set its controlling handle to the left of 0. This enable the left channel to be heard first, assuming other heads are to the right of 218. Time sequences may also be charted in relationship to tape speed.

Record and playback head positions may also be switched on and out, before or after other heads electronically via gang switches to be enabled in any sequence on any one or all channels, as desired.

Hence, we have shown how the present invention converts music transmitted over AM into stereo sound, with special effects induced by the user as desired.

Figure 4:
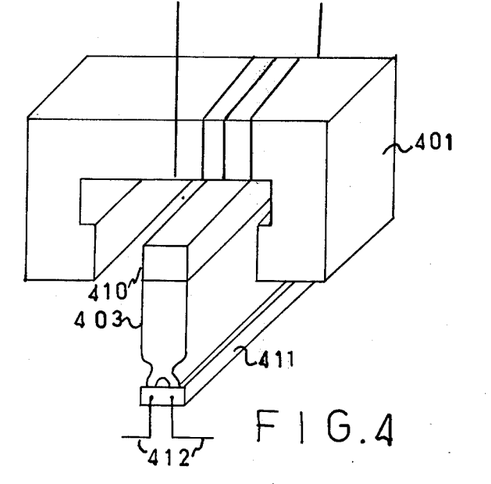
FIG. 4 is a drawing of the operation of the vibration means having an attached cartridge.

Demodulator 6, audio amplifier 11, volume control 13, and transmitter 14 are the same as in FIG. 1 as this FIG. 4 is connected to FIG. 1 at these points.

Note: by using a similar tape recording system and operation described for audio but using a higher rate of speed for the tape transport and video recording tape so as to carry a video signal a debth imagry may also be obtained so as to provide a 3-D affect.

Figure 3:
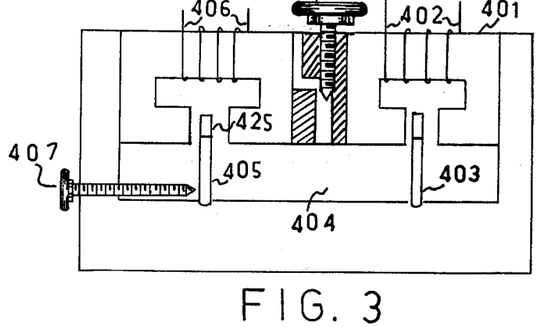
FIG. 3 is a drawing of the operation of the vibration means in a double core reactor.

FIG. 3 is an enlarged view describing the construction and operation of the vibrator means. C-core 401 having appropriate wire windings 402, 406, causes vibrations of permanent magnet 425 attached to soft plyable material 403, which will vibrate according to the signal input of coil 402.

Vibrator arm 403 and 405 are identical and are constructed to have a limited frequency response, responding only to very low frequencies, producing little or no output upon high frequencies.

As viabrator 403 vibrates, this creates vibration in closed chamber 404 causing thereby vibrator arm 405 to vibrate in accordance or "in tune", having the same frequency response as vibrator arm 403. The signal from wire winding 406 wound about a c-core identical to 401 is used as an input signal to an amplifier serving to further amplify the signal.

Note that vibrator arms 403 and 405 are designed to respond to and reqroduce the sound of low frequency instruments such as the drum. Thinner, more ridged vibrator arms, such as strings or needles, designed to respond to and to reproduce the sound of higher frequency instruments are likewise and similarly installed in c-cores similar to the installation shown. However, a smaller core gap is desireable for reproduction of treble instrument frequencies. Also the frequency response may be made to vary largely determined by the size and material of the vibrator arms. Hence, if vibrator arms 403 and 405 were a pin, for example, as such it would serve to filter out the bass and midrange frequencies. Vibrator arm 305 serves to further filter out any signals that beyond the frequency range desired.

Screw 407 serves to tighten or loosen vibrator arm 405 providing further control of frequency response. A similar screw may be placed against vibrator arm 403 thus serving to increase the frequency response of the vibrator arm. Similar screws may be placed against any type of vibrator arm used to reproduce the frequency of any instrument, treble or bass. Further, screw 407 provides a medium serving a user whereby he may obtain a higher or lower beat on a drum, for example, as a matter of listener preference.

Screw 408 serves to increase or decrease the air flow into chamber 404, thus providing a further control of frequency response and desired emanating from the vibrations of arms 405, 403. Screws similar to that of 408 may be similarly placed near screw 407 or elsewhere along chamber 404 for desired sound reproduction.

FIG. 4 shows a three dimensional view of a wired c-core 401 and vibrator arm 403 with permanent magnet 410. Cartridge 411 is a magnetic or ceramic cartridge that may be attached to vibrator arm 403, serving to eliminate the use of a second c-core and vibrator arm 405, as well as the use of preamplifiers. Wires 412 serve as the output of cartridge 411.

Figure 5:
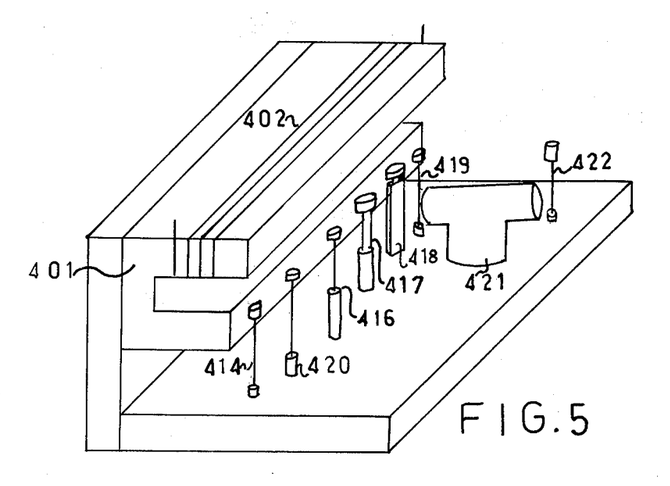
FIG. 5 is a drawing of various viabrator arms in a cut-a-way core.

FIG. 5 is a cut-a-way view of a c-core similar to 401 whereby vibrator arms designed to reproduce the frequencies of numerous instruments within the bass midrange and treble sections Vibrator arms 414-417, 419, 422, of various thicknesses and length for reproducing the frequencies and wave forms of various instruments are represented. Adjustable enclosure 420 further provides the means for refinement and adjustment of frequencies of the said arms. Such adjustments are made by setting the adjusting enclosure surrounding the vibrator arm to desired height, manually or via relays. Such enclosures provide the means of having each vibrator arm react only to a predetermined frequency, upon an inductance from Core 401 via wire 402. A partitioning wall (not shown) separates all vibrator arms to prevent mixing of frequencies. Cartridges may be used as shown above in lieu of partitions. 421 provides the operation of an echo chamber, echoing the vibrations of 419, 422, as 421 is open at both ends. This would aid in the reproduction of wind instruments.

Figure 6:
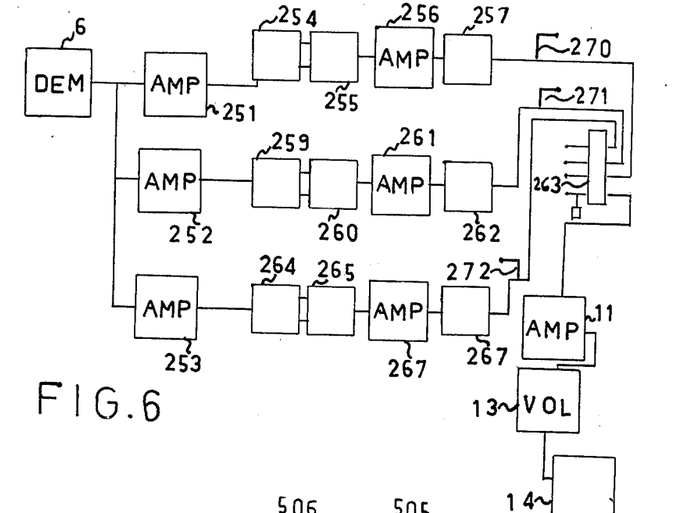
FIG. 6 is a diagram of the means providing for higher fidelity from instrumentation and/or instrument sound substitution.

FIG. 6 is a block diagram illustrating how the vibration means are utilized for (1) removing the voice signal from a voice-music composition (2) providing higher fidelity from instrumentation (3) providing substitute instrumentation i.e. to convert at will from one instrument to another while music is being played over the air.

The output of demodulator 6 (FIG. 1) is separated into three different signal outputs: 251, 252, 253—although the signal may further be separated for finer refinement. Amplifier 251 is so designed so that it amplifies only the frequencies eminating from bass instruments while rejecting others. Amplifier 252 is designed to reject to reject the high and low frequencies of bass and treble, allowing the midrange frequencies only. While amplifier 253 removes midrange and low signals having a signal output of the high frequencies in the audio range. Although voice signals may pass amplifiers 252–253, a voice signal will be removed almost entirely by components 254–267. 254 comprises the first vibration means shown in FIG. 3 (401–404). 255 comprises the same mechanism as that of 254 (also shown in FIG. 3 405–407) and will vibrate in tune with 254. However the signal of 255 is used as a signal to drive amplifier 256 while the signal of 254 is used as the signal output of amplifier 251. In this case, vibrator arms (see 403,405, FIG. 3) are so constructed as to vibrate at low bass frequencies, thereby filtering midrange and treble instruments.

The output of amplifier 256 may be further filtered by vibrations 257 which comprise the identical means of 254,255. The output of 257 is fed into amplifier 11 (FIG. 1) via switch 263.

The same is the process for midrange instruments. Their notes are amplified by amplifier 252 and the resultant output is fed to vibration means 259, 260 and the output fed to amplifier 261, serving to filter out the highs and lows while allowing only frequencies in the midrange category. This output is filtered again by vibration means 262 which is similar to 259, 260, and thereafter fed to amplifier 11 (FIG. 1).

The same filtering process occurs when treble instruments are played. They are amplified by amplifier 253, with the output signal fed to vibration means 264–265 so designed to filter out the low and midrange frequency signals (see FIG. 5 pins 414,417) The output of 265 is fed to amplifier 266 and filtered again by vibration means 267 which is similar to 265 with the output thereof fed to amplifier 11.

Note that although stages 255, 260, 265, may all be connected to a single amplifier such as 256, however, better results are usually obtained by using three amplifiers than from a mixed signal from one amplifier.

All signals mixed in amplifier 11 are fed to volume control 13 and thereafter to transmitter 14 (see FIG. 1).

Note also, that when switch 276 is enabled, all four prongs connecting to instruments being controlled by leads 270 (bass) 271 (midrange) 272 (treble) will be joined when switch 276 is released, said leads will form separate channels.

Thus, the voice signal is removed as the vibration means will provide the musical signal (of greater fidelity) to amplifier 11. Substitute instrumentation is enabled via switch 276.

Note, to create stereo separation of the bass midrange and treble ranges 270, 271, 272 would connected to terminals 270, 271, 272 in FIG. 2 and/or directly to the right and left input of the matrix mixer 232 in FIG. 2.

Also, we can provide also instrument substitution whereby, for example, reactor 401 (FIG. 4) and its vibrator arm 403 would vibrate to the frequency of a drum. Output signal stemming from wire 412 which is the actual drum signal will be fed to an amplifier and amplified to drive a second reactor identical to 401 whereby, instead of using vibrator arm 403 which reacts to the bass instrument such as a drum, we would substitute a vibrator arm designed to vibrate to a treble instrument such as a violin. The second reactor's vibrator arm 403 will be forced to vibrate due to a strong signal applied to magnet 410. The cartridge signal output of the second vibration means is fed to another amplifier and its output would be fed to a third vibration means (see FIG. 4) similar to said second vibration means, thus empowering the newly created signal which has been converted from a drum to a violin whereby the violin would play at the signal input of a drum.

It should be noted that cartridge 411 (FIG. 4) may be substituted by a variety of different means such as a moveable, flexible vibrator mounted onto a frequency coil, whereby an FM transmission coil would be used in transmitter 14 (FIG. 1). The vibration of the flexible material 403 would cause a deviation of the frequency of transmitter 14 and reflecting this deviation on an FM radio without any additional amplifiers (such as amplifier 11 in FIG. 1 and 266 in FIG. 3).

Note also, that when said FM transmission coil is used in transmitter 14 as described above, by placing one or more needles suitable for playing records, whereby said needle(s) are connected to said coil, this will cause vibrations to the coil which will thereby deviate transmitter 14's frequency signal being playable on an FM receiver without using any amplifiers.

For stereo application, the needle would cause a double deviation of two frequencies whereby one frequency would be used per channel.

It should also be noted that cartridge 411 may also be replaces by one or more lights whereby one or more lights would vibrate alone with vibrator arm 403 (FIG. 4) whereby the light beam(s) would be focused closer or away from one or more light emitting cells (ISC) as a direct result of the vibrations of the vibrator arm 403, and whereby, each single light beam when focused on a single LSC, each said ISC would be made to vibrate, producing multiple separate signals.

Note also that operation may be provided whereby said flexible material is connected to a coil of an FM transmitter, whereby the signal of the flexible material would be transmitted due to mechanical movement changes changing the frequency of the transmitter thereby transmitting its signal without any additional amplification.

Figure 7:
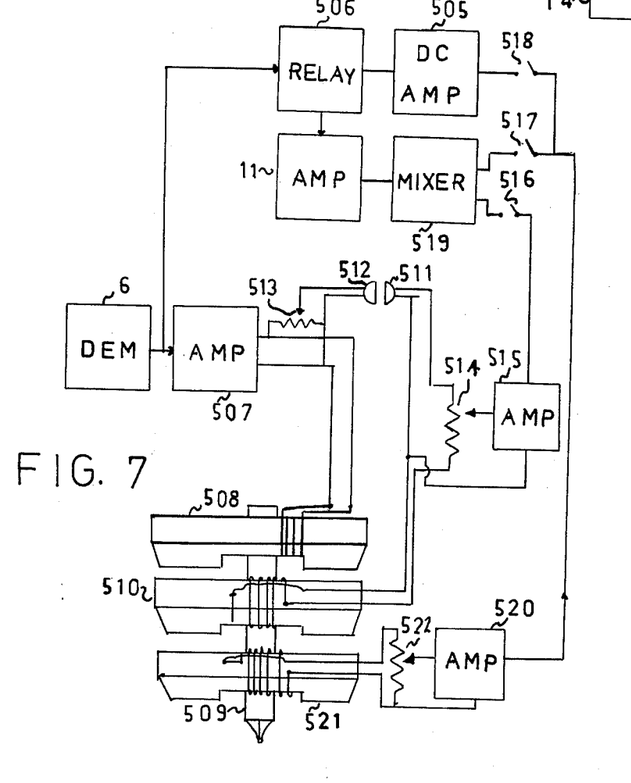
FIG. 7 is a drawing illustrating the means for removing either voice or music from a voice-music composition.

FIG. 7 is a diagram illustrating the means to enable the automatic removal of voice or the automatic removal of music from a music-voice composition played over the air or on audio equipment remotely controlled by the present invention (FIG. 1 e.g.) equipped with the following components:

The signal from demodulator 6 (FIG. 1) and fed to amplifier 507 and to a 3 c-core vibrator (see FIG. 4 for an enlarged front view of a c-core housing a vibrator arm and cartridge). C-core 508 inducts current causing the vibrator arm 509 to vibrate, hence causing inductance in C-cores 510, 521. C-core 510 thus has a signal output consisting also of the output of microphone 511 which receives its signal from microphone 512. Both microphones 511, 512 are enclosed in a sound proof container to prevent outside sound signals from entering microphones.

While microphone 511 receives music plus voice in a voice-music composition from amplifier 507 via volume control 513 adjusting the volume of microphone 512 also receives the adjusted voice-music output from microphone 511, C-cores 510, 521 obtains the identical phased musical signal-meaning, when a musical note is on the positive cycle, cores 510 521 will react identically on the positive cycle. However, core 510 will emanate a voice-music signal while core 521 will emanate a pure music signal.

The signals emanating from microphone 511 and core 510 are set by volume control 514 serving to set an even balance proportioning voice and music in accordance with listener preference. This set signal is received by amplifier 515 and mixer 519 via switch 516. At the same time the inducted signal of core 521 is similarly set by volume control 522 and fed to mixer 519 via amplifier 520 and switch 517.

Note that the signals of core 521 and 510 and microphone 511 have identical phasing and all are inserted into mixer 519 simultaneously. If a music not having 1 volt e.g. on the positive cycle emanated from core 521, then we would set volume control 514 so as to obtain a 1 volt total from the output of core 510 in conjunction with the output of microphone 511. Hence, both volume control 514 and 522 would be set so that the output of core 521 equals the in phase output of core 510 including that of microphone 511. All signals will thus cancel each other in mixer 519, since all signals are in identical phase and amplitude. This allows music signals only to pass from C-cores 510 and 521. Should a voice signal emanate from cores 510 and 521 it would be very weak as compared to the signal emanating from microphone 511.

Hence, a voice only signal from microphone 511 will be amplified by amplifier 513 and mixed in mixer 510, thereafter passed to output amplifier 11 (FIG. 1). As such, a voice signal will not be cancelled by a weak voice signal emanating from the cores.

However, as a musical signal is sounded, this will also cause a signal to emanate from cores 511, 510 providing the cancellation signal in mixer 519 to cancel out musical note resulting in a voice only output.

Should a user prefer to listen to music only omitting the voice, he would close switch 516, removing thereby the output of microphone 511 (voice).

Should the listener prefer to have an automatic turn on of voice, he would close switch 518, connecting thereby a music signal via amplifier 20 into DC amplifier 505 activating relay 506.

Relay 506 having a time delay means will hold even after the music has stopped for a few seconds. However, when it opens—as a direct result of lack of music—it connects the signal from demodulator 6 (FIG. 1) to amplifier 11, connecting thereby the voice output.

Should the music return, signals will be returned via amplifier 520 changing relay 506 after a few seconds thereby disconnecting voice signals while retaining music signals only.

To set controls for a musical output only, the following is the procedure: (1) set volume control 514 at center with music playing (2) set volume control 522 to center (3) set volume control 513 to center (4) by monitoring the output of amplifier 11 (FIG. 1) the listener rotates volume control 522 to obtain the lowest output possible (5) rotate volume control 514 for audible sound from amplifier monitor 11, 12, (FIG. 1).

When a mixed added in audio signal will be fed in, the apparatus will cancel the music but will transmit the voice. Should the voice signal be very low, volume control 513 is rotated slightly for increased sound. Mixer's output 519 would be connected to amplifier input 251, 252, 253, (FIG. 2).

Figure 8:
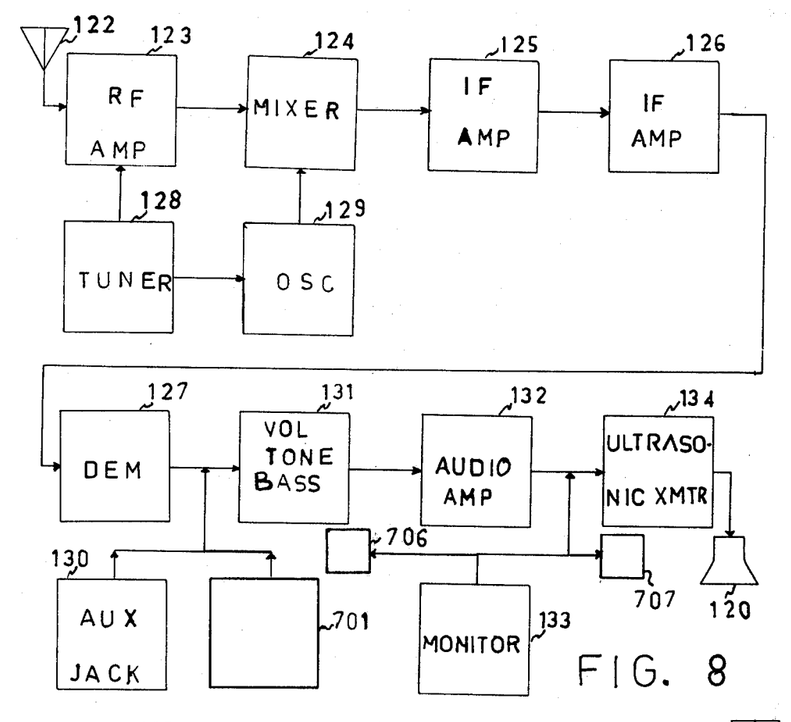
FIG. 8 is a block diagram of a remote control device operating on ultrasonic, invisible and visible light frequency ranges, controlling radio receivers remotely, wirelessly.

FIG. 8 is a block diagram of a remote control device operating on ultrasonic, invisible and visible light frequency ranges, controlling radio receivers, magnetic playback systems wirelessly, and connected monitors.

In operation, stages 122–129 comprises the tuning operations thereby tuning and selecting a desired channel and station, changing same into an IF signal, demodulating the IF signal for retreiving the intelligence information, as follows:

Antenna 122 picks up all the radio station signals and feeds them to RF amplifier 123. RF amplifier 123 amplifies the signal of tuner 128 selected in conjunction with oscillator 129. Mixer 124 produces the IF signal amplified by IF amplifier 125, 126 and demodulated by demodulator 127 serving to separate the IF signal from sound signal which is controlled by volume control 131, adjusting the bass, treble and midrange.

The input auxiliary jack 130 enables the mixture of audio signals from an audio source to be fed into the vol, bass, tone, controls 131. A magnetic pick up means 701 such as a magnetic pick up coil or c-core for feeding signals wirelessly from a magnetic output to the input of 131.

Audio amplifier 132, will amplify the signal stemming from 131 and feed it output signal to 3 transmitters comprising of ultrasonic transmitter 707 and to a light transmitter 706 and to monitor 133. Note by the use of seperate stages comprising of 131, 132, connected seperately to each transmitter 706, 707, 134 would enable a user to control each transmitter at a level of volume bass tone on other controls that may be added as desired.

Figure 9:
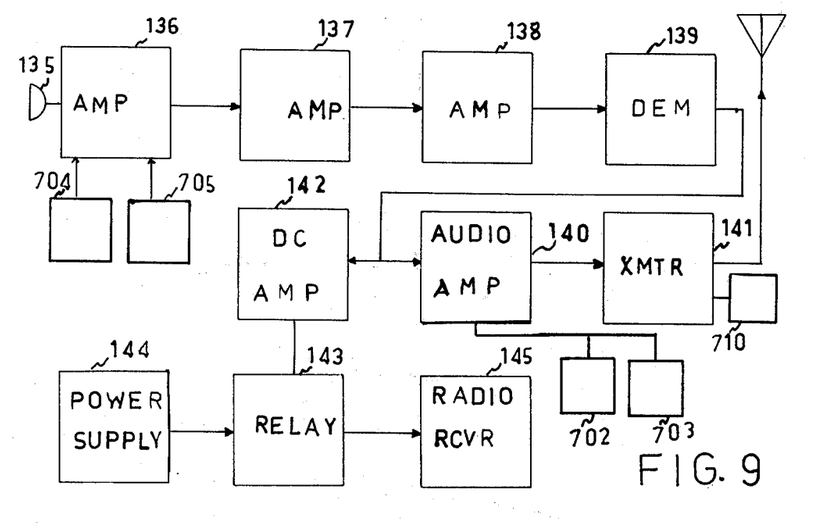
FIG. 9 is a drawing for the remotely located coupler closely coupled to a radio receiver for retrieving intelligence signals and reproducing the same.

FIG. 9 is a drawing for the means of receiving and demodulating the signals of the said 3 transmitters. Microphone 135 receives the ultrasonic signal from the ultrasonic transmitter 134 and feeds it to amplifier 136. Light sensitive cell 704 receives the visible light signal from transmitter 706 and feeds its signal to amplifier 136. Infra-red signal receiving m means 705 receives its signal from transmitter 707 and feeds its signal to amplifier 136. Amplifier 136 amplifies the received signals and feeds same to amplifier 137, thereafter the signal is fed to amplifier 138 after being amplified. Demodulator 139 demodulates the signal from amplifier 138 and feeds its signal to an audio 140 and to DC amplifier 142. DC amplifier 142 amplies a DC voltage to activate relay 143 thereby feeding current from power supply 144 to receiver 145. The output of amplifier 140 is fed to three stages: to transmitter 141 which transmits the signal as a radio signal to a reactor such as a c-core 703, transmitting the audio signal as a magnetic signal and to an auxiliary output 702 producing an output signal source to drive audio or video monitors.

Note each receiving means, such as microphone 135, LSC 704 and infra-red 705 may be connected to 3 similar receiving means such as 3 apparatuses as that of FIG. 9 for controlling 3 separate units.

Note also light and invisible light transmitter in conjunction with their respective receivers can operate on actual visible or invisible light by increasing or decreasing light intensity or amplitude, or whereby the signals are first placed on a frequency carrier and thereafter the carrier modulating the visible and invisible light transmitters. By the use of frequency carriers interference is greatly eliminated from other sources entering the receiver due to the fact that the carrier would now be tunable and selectable.

Also, beams of the visible and invisible light can be focused so as to achieve a very thin beam thereby enabling the user by merely pointing the beam at the slave receiver (FIG. 9) will thus activate and control the TV or radio receiver.

Note also this would enable a user to shift operation from one TV set to another in very close proximity so long as the beam wil not enter both sets at the same time. Also by the use of reflectors, a user may operate numerous receivers in different locations. Focusing aids may be provided by using fiber optic rods.

It should be noted that FIGS. 8, 9 can operate on a selective bases of color codes such as a red colored light activating a red LSC, a green colored light activating a green LSC and so on, thus controlling by selecting different light signals.

Note that special auxiliary 710 operates whereby transmitter 141, being an FM transmitter, would be employed.

Auxiliary 710 is a special auxiliary means whrerby it is employed as a mechanical modulator, modulating transmitter 141.

An example of this employment is as follows: a needle suitable for playing records on a record player is inserted into auxiliary 710. The needle playing a record would cause mechanical vibrations in transmitter 141, changing thereby its frequency to same. This change would occur due to mechanical vibrations of a frequency coil or a core in a coil or metalic diaphragm acting as a capacitor in such a way so as to change the frequency of transmitter 141. The frequency change is reflected on the FM band. In general, a higher frequency would provide better fidelity.

Figure 10:
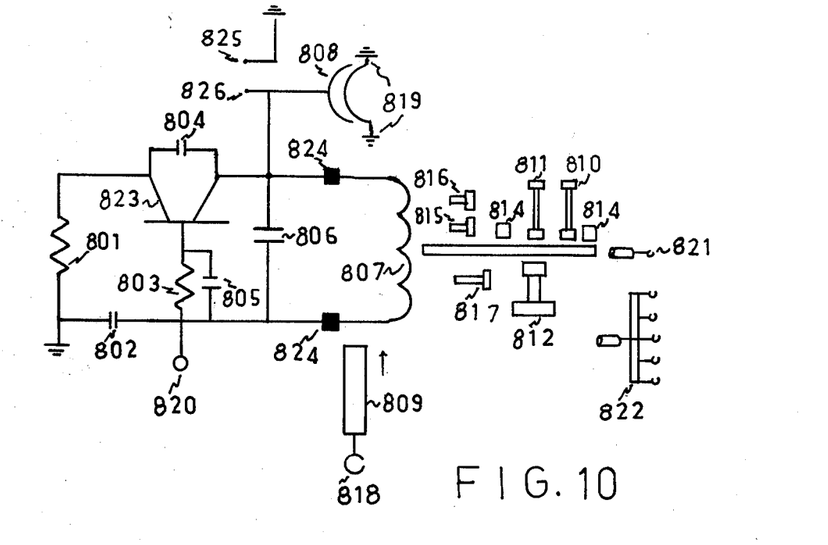
FIG. 10 is a drawing describing how a special auxiliary modulates a transmitter by mechanical modulation.

When used as a cartridge, auxiliary 710 and transmitter 141 would be placed on the playing arm riding over a record as shown in FIG. 10. A tiny battery would be the power source for transmitter 141, as transmitter 141 may be built to the size of a cartridge.

Perhaps, the greatest advantage in using auxiliary 710 in conjunction with transmitter 141 is; no further amplification is necessary in the transmitter, while a high quality sound is produced, over an FM receiver.

For stereo, the needle would engender two frequency signals closeby on the FM band, or whereby the main carrier would have a subcarrier. The main carrier would be vibrated by the movement of the record needle while the subcarrier being vibrated by a second part of the stereo movement stemming from the record.

Note all types of movement causing vibrations such as guitar strings touching auxiliary 710 would cause their signal to be reproduced over FM radio.

FIG. 10 is a diagram describing auxiliary 710 modulating transmitter 141 by mechanical modulation.

In operation, resistor 801 connects emitter of transistor 823 to ground power. Resistor 803 biases transistor 823 whereby it is connected from base of transistor 823 to power input 20. Capacitor 802 is a filter capacitor, acting as a bypass for the high frequency of the transmitter 141. Capacitor feeds the signal of the base of transistor 823 to filter capacitor 802 thus feeding the signal to ground. Coil 807 connects collector of transistor 823 to power input 820. Capacitor 804 passes a feedback signal from coil 807 connected to collector of transistor 823 to resistor 801 connected to emmiter of transistor 823, causing it to oscillate whereby coil 807 will transmit its signal.

Capacitor 808 is a special capacitor acting as a microphone. Capacitor 808 is constucted whereby the left disk is of aluminum and set into a stable position. A wire is connected thereto leading to coil 707 where coil 707 joins collector of transistor 823.

A second fine disk of capacitor 808 (right side) made of thin aluminum is suspended by conductive springish material 819 thereby keeping second disk from just about not touching left disk. Material 819 is connected to ground thereby right disk is at ground level in relationship to signals.

Capacitor 808 will now act as a tuning capacitor whereby the left side in conjunction with right side set a cirtain resonance signal in conjunction with coil 807. When any vibration such as sound enters the diaphragm (right side) which acts as a microphone it will be made to vibrate changing the frequency of transmitter 141; whereby when right disk is closer to left disk, the frequency of the transmitter is lowered, reversely, when further away. Note that right disk may be made of pure aluminum foil.

Another application in changing the frequency of transistor 141 is provided by bar 809 passing into coil 807 thereby lowering the frequency of coil as it passes into the coil, increasing the frequency as it moves out. By connecting a guitar string onto hook 818, vibrating string will vibrate bar 819 and coil 807 thereby changing the frequency of transmitter 141, reproducing the sound of the guitar.

Most versatile, is arm 823 when connected to the center of coil-spring 807 which is used as a spring and as a coil and is mounted onto posts 824 to keep it in place. Vibrations over coil 807 will cause it to expand and contract. When it expands it will increase the frequency of transmitter 141 and reversely when it contracts. Any mechanical movement of arm 823 will be reflected as a frequency change. Hence, cap 821 fitted with a needle suitable for playing records, will provide the mechanical means for the vibrations of the record to be reflectd over transmitter 141 via coil-spring 807.

Coil-spring 807 is made to reverberate, thus causing a reverberation to the sound transmitted. Reverberations may be increased or decreased by plastic screws 815-817. When rotated so as to touch coil-spring 807, will slow the reverberations of coil-spring 807.

Volume, bass and treble controls are provided by controls 810 811,812. Volume control 812, when rotated towards arm 823 will squeeze arm 823 between rubber posts 814 and its own rubber shoe thus lowering the reverberation of arm 823. The reverse holds true when volume control 812 is moved away from post 814. Bass control 810, when rotated toward arm 823 will remove high frequency reverberations of arm 823. This is accomplished in conjunction with the shoe of screw 810 which is constructed of extremely soft material pressing against arm 823. Similarly, when tone control's 811 shoe pressing against arm 823 will remove low bass frequencies. This is primarily due to the action of the shoe of control 811 being constructed of harder material than that of 810, thereby removing low frequencies of bass instruments such as that of a drum.

The edge of the right side of arm 823 act as the mechanical input whereby any cap placed thereon will function similarly. For example, if cap 821 is replaced by cap 822 and when cap 822 is hooked onto the strings of a guitar or violin, it will reproduce the sound of the connected instrument.

Wind instruments such as accordians, having metalic objects vibrating therein producing the sound; clarinets having their reeds attached to small pieces of metal or foil may serve to reproduce their sound over transmitter 141. E.g. 825 is a capacity changing input. If a wire attached to the metal foil which was attached to the reed of the instrument was connected to input 825 and another wire connected the to the metal (ground) casing of the instrument is connected to input 826, vibrations at the reed causes a smaller or larger gap between metal case and reed, thus changing frequency of transmitter 141.

Similarly, percussion instruments having metal objects vibratine in similar manner as discribed above causing an increase or decrease in the gap will produce the sound output over transmitter 141 when connected to input 825, 826.

Note, coils similar to coil 807 may be added in series or parallel connections so as to provide multiple outputs whereby each coil reacts to a different frequency. Also frequency doublers may be used whereby one oscillator driving many frequency doublers and whereby frequency doubler's means for changing frequency and/or amplitude and/or phase to creast outputs from special auxiliary such as 710, thereby providing the means for many special auxiliary means for a single unit.

Note also by changing the resting frequency to lower or higher frequency different selections may be chosen e.g. to produce a drum through auxiliary 710 a low carrier frequency may be used thereby reproducing the drum signal but not being affected by higher frequency instruments. Similarly by changing the carrier of transmitter 141 to a higher frequency, more detailed signals would be received.

We claim:

1. Remote radio channel selection and plural function control apparatus comprising:
   a. A tuner for receiving a radio signal including audio information modulated on a carrier on any one of a plurality of channels:
   b. means located at said control apparatus for manually varying the channel selection of the tuner,
   c. a demodulator connected to said tuner for providing said audio information in a baseband format,
   d. means comprising of an auxiliary jack means and a magnetic pick up coil means located subsequent of the demodulator to facilitate the addition or mixing of an auxiliary intelligence signal into the incoming signal when it is in the baseband format,
   e. means comprising of record/playback means connected between said auxiliary jack means and controls for selecting the mono bass, midrange, treble signals or other mono frequency range signals, separating said mono signals to a two or more channel stereo signal; for feeding said selected mono, midrange, bass signals or other frequency range signals, to one channel; for feeding a balanced input of all said signals to all channels; for feeding some of the said signals with a balanced input into all channels while some of the said signals are fed to one channel only; for feeding an unbalanced signal from some or all said selected signals to all channels; for delaying said selected signals from another of said selected signals so as to cause a resultant output from stereo channels whereby one of said frequency range signals will lead another of said frequency range signals by any desired delay level resulting in three or more signals, one emanating after another, from two or more channels,
   f. means comprising vibration means, whereby musical signals cause vibrators to vibrate, each of said vibrators vibrating to a selected signal and thereafter feeding their newly created vibration signal to a signal input source thereby recreating a new signal through said vibration means and whereby a combination of many of said vibrators selected for a variety of frequency vibration ranges produce thereby a new live music sound signal source whereby said new live sound signal source does not stem from the original electromagnetic baseband signal source but from vibrators vibrating as a result of said original electromagnetic baseband signal source, which said new signal may be placed mono or stereo, whereby all outputs of said vibration means are fed to a mono amplifier or separated into two branches to form a stereo output and to convert the frequency signals of said original electromagnetic signal emanating from one instrument. Whereby said signal acts to reproduce the said new live signal source of another instrument through said vibration means whereby the said original electromagnetic signal causes said vibration means to vibrate to a different frequency and whereby voice signals may be removed from a music-voice composition resulting in a music only output emanating from speakers and whereby producing over said speakers a voice only output from a music-voice composition by mixing means,
   g. means located at said control apparatus for manually varying the characteristics of the baseband audio information as a function of listener preference,
   h. means for remodulating and transmitting electromagnetically the audio signal to a remotely located radio receiver on an unused channel via wireless transmission, and,
   i. the remote control of both tuning and other receiver functions being effected without direct connection or modification to the receiver.

2. An apparatus of claim 1 wherein said vibration means comprising,
   (a) a wired core reactor means causing a magnet mounted on a first flexible material to vibrate to a single frequency or frequency range whereby its vibration causes a second of said flexible material to vibrate to the frequency of said first flexible material when placed closeby, (b) a chamber for aiding the passage of the output energy of the vibrations of said first flexible material to cause vibrations of said second flexible material, (c) screw means for adjusting the frequency of vibrations of the said flexible material, (d) a second screw means for adjusting the air flow of said chamber.

3. An apparatus of claim 1 wherein said vibration means comprising, (a) a wired core reactor means causing a magnet mounted on, flexible material to vibrate to a given frequency or frequency range, (b) a cartiridge or a light sensitive cell mounted on said flexible material.

4. An apparatus of claim 1 wherein said vibration means comprising, a wired core reactor means causing a magnet mounted on flexible material to vibrate to a given frequency or frequency range, and whereby said flexible material is connected to a coil of an FM transmitter, whereby the signal of the said flexible material would be transmitted due to machanical movement changes changing the frequency of the transmitter thereby transmitting its signal without any additional amplification.

5. An apparatus of claim 1 wherein said record/playback means comprises a plurality of recording means for recording the single baseband signal on magnetic tape, converting said single signal to a plurality of recorded signals, and a plurality of moveable and adjustable heads and adjustable amplification means for channeling the said plurality of recorded signals into two or more channels.

6. A plurality of remote control apparatuses of claim 1 wherein is provided the means located at each one of said plurality of remote control apparatuses when each one is tuned to receive the composit signal from one of the other of said remote control apparatus wirelessly, and to retransmit signals to another of said remote control apparatus within transmitting range from one to the other so as to provide said plural function control of a receiver by one or more of said remote control apparatuses that are in or beyond transmitting range of said receiver, providing low power transmission for great distances, and whereby a single composite signal being received at a first said remote control apparatus and receiver and retransmitted, a second composite signal at the second transmitter of a second remote control apparatus resulting from the received signal from the first said remote control apparatus and an additional signal from its own said auxiliary jack input, a third composite signal at a third said remote control apparatus or receiver and retransmitted by said first remote control apparatus on one or more different bands, resulting from the reception of the signals of the first and second said remote control apparatus and the additional signal from its own said auxiliary jack input means, and so on whereby two signals would be received at said remote control apparatuses in the transmission range area of said second remote control apparatus while three signals would be received by said remote control apparatuses in the transmission range area of said third remote control apparatus, and so on.

7. Remote radio channel selection and plural function control apparatus comprising:

a. A tuner for receiving a radio signal including audio information modulated on a carrier on any one of a plurality of channels, b. means located at said control apparatus for manually varying the channel selection of the tuner, c. a demodulator connected to said tuner for providing said audio information in a baseband format, d. means comprising of an auxiliary jack means and a magnetic pick up coil means located subsequent of the demodulator to facilitate the addition or mixing of an auxiliary intelligence signal into the incoming signal when it is in the baseband format, e. means located at said control apparatus for manually varying the characteristics of the baseband audio information as a function of listener preference, f. means for remodulation and transmitting wirelessly on an invisible infra-red light signal and on an ultrasonic sound carrier and on a visible light signal of various colors for controlling one or more radio or video receivers, g. receiver means, comprising a microphone, a light sensitive cell and an infra-red receiver, h. amplifying-means for amplifying said ultrasonic, invisible and visible light signals, i. a demodulator connected to said amplifying means for demodulating said amplified ultrasonic, visible, and invisible light signals, j. an audio amplifier means connected to said demodulator, and to a DC amplifier means whereby said audio amplifier feeds its output to a wired core reactor means and to an auxiliary output jack means and to a transmitter for transmitting its signal to a nearby receiver and to an unconnected magnetic playback system and whereby said suxiliary output jack means is wired to a monitor, to retrieve and reproduce said intelligence signal, k. a special auxiliary means connected into said transmitter said transmitter transmitting to a nearby receiver which said special auxiliary means modulates the said transmitter mecahanically, l. a relay switch means connected to said DC amplifier means connecting a radio receiver to a power supply for switching AC current to said ratio receiver and/or to other household appliances, m. the remote control of both tuning and other receiver functions being affected without direct connection or modification to the receiver.

8. An apparatus of claim 3 wherein said core reactor means comprising a C-shaped core.

9. An apparatus of claim 7 wherein said special auxiliary means comprises an arm connected to a loose coil of a transmitter and a loose moveable core moving in and out of said loose coil and a moveable metalic disk placed nearby a fixed metalic disk whereby said disks is made to react to a signal as does a capacitor, which said fixed disk is connected to said moveable coil whereby said moveable coil, core, and moveable disk vary the frequency of the said transmitter due to the mechanical vibrations of vibrating objects connected to said arm or whereby vibrations of said moveable disk itself causes a change of said frequency.

10. The control apparatus of claim 7 wherein the said auxiliary means provide an intelligence signal derived from an audio signal of an audio or vidio apparatus.

11. The control apparatus of claim 10 wherein the remotely controlled radio receiver and a remotely located wireless coupler is closely coupled but not connected to a magnetic play back system or radio receiver or wired from its said auxiliary jack means to an audio monitor for retrieving the auxiliary intelligence-signal and reproducing the same.

12. An apparatus of claim 7 whereby said apparatus is controlled by another apparatus of claim 7 wirelessly.

* * * * *